(12) United States Patent
Marie et al.

(10) Patent No.: US 9,654,057 B2
(45) Date of Patent: May 16, 2017

(54) SOURCE OR EMITTER FOLLOWER BUFFER CIRCUIT AND METHOD

(75) Inventors: Herve Marie, Ver sur Mer (FR); Lionel Guiraud, Blainville sur Orne (FR)

(73) Assignee: NXP, B.V., Eindhoven (NL)

( * ) Notice: Subject to any disclaimer, the term of this patent is extended or adjusted under 35 U.S.C. 154(b) by 74 days.

(21) Appl. No.: 13/431,505

(22) Filed: Mar. 27, 2012

(65) Prior Publication Data
US 2012/0249191 A1  Oct. 4, 2012

(30) Foreign Application Priority Data

Apr. 1, 2011 (EP) .................................... 11290167

(51) Int. Cl.
| | | |
|---|---|---|
| *H03F 1/08* | (2006.01) | |
| *H03F 3/50* | (2006.01) | |
| *G11C 27/02* | (2006.01) | |

(52) U.S. Cl.
CPC ............. *H03F 1/086* (2013.01); *H03F 1/083* (2013.01); *H03F 3/505* (2013.01)

(58) Field of Classification Search
CPC ............................... G11C 27/02; G11C 27/026
USPC ................................................... 327/108, 111
See application file for complete search history.

(56) References Cited

U.S. PATENT DOCUMENTS

| | | |
|---|---|---|
| 4,847,566 A | 7/1989 | Lee |
| 5,121,082 A | 6/1992 | Matsuzawa |
| 5,874,858 A | 2/1999 | Furuya |
| 6,650,263 B1 * | 11/2003 | Dillon ........................... 341/122 |
| 6,778,013 B1 | 8/2004 | Ali |
| 7,119,584 B1 * | 10/2006 | Ali .................................. 327/91 |
| 8,339,161 B2 * | 12/2012 | Ali ................................ 327/108 |
| 2002/0036326 A1 * | 3/2002 | DeJong ..................... G05F 3/30 257/369 |
| 2006/0164133 A1 | 7/2006 | Fukui et al. |
| 2009/0315594 A1 | 12/2009 | Pentakota et al. |
| 2010/0214020 A1 | 8/2010 | Cooney |

FOREIGN PATENT DOCUMENTS

| | | |
|---|---|---|
| EP | 1 633 041 A2 | 3/2006 |
| JP | 61-062216 A | 3/1986 |

OTHER PUBLICATIONS

Ali, A., et al. "A 16b 250MS/s IF-Sampling Pipelined A/D Converter with Background Calibration," 2010 IEEE Int'l. Solid-State Circuits Conf., vol. 45, No. 12, pp. 293-294 & continuation (Dec. 2010).

Extended European Search Report for European patent appln. No. 11290167.3 (Dec. 19, 2011).

(Continued)

*Primary Examiner* — Lincoln Donovan
*Assistant Examiner* — Colleen O Toole

(57) ABSTRACT

In one aspect, a buffer circuit comprises a source or emitter follower input stage and output stage. A load is provided between the stages which comprises a representation of an output load of the buffer circuit. This improves the circuit linearity whilst enabling a high input impedance to be obtained.

In another aspect, a buffer circuit comprises a source or emitter follower output stage. A load is in the form of a filter is provided and which comprises a representation of an output load of the buffer circuit.

15 Claims, 5 Drawing Sheets

(56) References Cited

OTHER PUBLICATIONS

Jianhua, Huang, et al; "Analysis of CMOS Current Mirror's Principle and Practice"; Ship Electronic Engineering, vol. 29., No. 6; China Academic Journal Electronic Publishing House; 4 pages; (Jun. 2009) English Abstract.
Office Action from counterpart application 201210089134.6 (Sep. 3, 2014).

* cited by examiner

SOURCE OR EMITTER FOLLOWER BUFFER CIRCUIT AND METHOD

CROSS-REFERENCE TO RELATED APPLICATIONS

This application claims the priority under 35 U.S.C. §119 of European patent application no. 11290167.3, filed on Apr. 1, 2011, the contents of which are incorporated by reference herein.

This invention relates to source or emitter follower circuits.

A source follower is a basic FET-based amplifier configuration, also known as a common drain amplifier. An emitter follower is a basic BJT-based amplifier configuration, also known as a common collector amplifier. These circuits are typically used as voltage buffers, for example having unity voltage gain and current gain approaching infinity.

The source/emitter follower stage is a buffer circuit used in many analogue circuits. A key parameter is its capability to drive a low impedance load, without signal distortion, while being operated at low bias current.

In particular, the source/emitter follower stage is used as the driving circuit for high speed switched capacitor-based analogue to digital converters.

The buffer circuit is desired to have as linear transfer function as possible.

US2009/0315594 discloses a circuit topology that includes a dummy capacitive load to provide improved linearity. However, such a circuit has a problem of creating a low input impedance load.

There is therefore a need for circuit topologies to improve the source/emitter buffer performance to increase the range of applications in which the circuit can be used. In particular, there is a need to reduce distortion and improve linearity, but at the same time provide a high impedance load.

According to a first aspect of the invention, there is provided a buffer circuit, comprising:

an input stage comprising a source or emitter follower transistor;

an output stage comprising a source or emitter follower transistor and a current source circuit, in series between voltage supply lines; and a load provided between the output of the input stage and the current source circuit of the output stage, wherein the load comprises a representation of an output load of the buffer circuit.

This circuit provides a representation of the output load between an input and output stage. This representation of the load causes a current to flow which improves the linearity of the buffer circuit. The use of an input stage before the added load increases the input impedance of the circuit.

According to a second aspect of the invention, there is provided a buffer circuit comprising:

an output stage comprising a source or emitter follower transistor and a current source circuit, in series between voltage supply lines; and a load provided between an input and the current source circuit of the output stage, wherein the load comprises a representation of an output load of the buffer circuit, wherein the load comprises a filter circuit.

This arrangement enables improved linearity for the buffer circuit even when a more complicated load (in the form of a filter) is being driven by the buffer.

The current source circuit of the output stage can comprise a first cascode transistor having an input connected to the source or emitter of the source or emitter follower transistor, and wherein the load is provided between the output of the input stage and the output of the first cascode transistor. This provides a feedforward mechanism.

In one example, the load corresponds to the output load (i.e. it is a replication of the output load).

The load of the first aspect of the invention can comprise a capacitor for a circuit with a capacitive output load, or it can comprise a filter circuit for a circuit with a filter at the output.

In the case of a filter circuit (for both aspects of the invention), the load can comprise a filter circuit with an open circuit output, and the load is defined between the filter circuit input and the ground terminal of the filter circuit.

This connection of the filter circuit is used to replicate the current flowing to ground through the filter circuit for an open circuit output. This means the full current drawn by the filter circuit is passed on through the ground terminal so that the appropriate compensation for the current of the output load takes place.

In both aspects, the output stage can comprise a second cascode transistor, wherein the first and second cascode transistors together define a current mirror circuit, and the load can comprise a load in the form of a scaled version of the output load, with the scaling dependent on the mirror ratio of the current mirror circuit.

This arrangement enables the output load to be represented by a scaled down version in the feedforward path, thereby reducing the required circuit area. In the case of a load capacitor. It then has a value equal to a fraction of the capacitance of the output load.

This scaling approach can also be used for a load in the form of a filter circuit. In this case, the load again comprises a filter circuit with an open circuit output, and the load is defined between the filter circuit input and the ground terminal of the filter circuit. However, the scaled version of the filter circuit has capacitances scaled down by a scaling factor and inductances scaled up by the scaling factor.

An input stage can be provided, with the same design as the output stage. Thus, the input stage can comprise a source or emitter follower transistor and a current source circuit, in series between voltage supply lines, wherein the current source circuit of the input stage comprises a first cascode transistor having an input connected to the source or emitter of the source or emitter follower transistor.

The buffer circuit is preferably part of a circuit which includes the load connected to the output of the buffer circuit. The overall circuit can for example be an analogue to digital converter circuit.

The first aspect of the invention also provides a voltage buffering method, comprising:

providing an input voltage to an input stage comprising a source or emitter follower transistor;

deriving an output voltage from an output stage comprising a source or emitter follower transistor and a current source circuit, in series between voltage supply lines, and providing the output voltage to an output load, wherein the method comprises providing a load between the output of the input stage and the current source circuit of the output stage, wherein the load comprises a representation of an output load of the buffer circuit.

The load can comprise a scaled version of the output load.

The second aspect of the invention also provides a voltage buffering method, comprising:

providing an input voltage to an output stage comprising a source or emitter follower transistor and a current source circuit, in series between voltage supply lines, deriving an output voltage and providing the output voltage to an output load, wherein the method comprises providing a load between the input and the current source circuit of the output stage, wherein the load comprises a filter circuit which is a representation of an filter circuit output load of the buffer circuit.

Examples of the invention will now be described in detail with reference to the accompanying drawings, in which.

In one aspect, the invention provides a buffer circuit which comprises a source or emitter follower input stage and output stage. A load is provided between the stages which comprises a representation of an output load of the buffer circuit. This improves the circuit linearity whilst enabling a high input impedance to be obtained. In another aspect, a buffer circuit comprises a source or emitter follower output stage. A load is in the form of a filter is provided and which comprises a representation of an output load of the buffer circuit. This enables compensation of the current through a more complicated output load, to give improved linearity for a wider range of applications.

Figure 1:
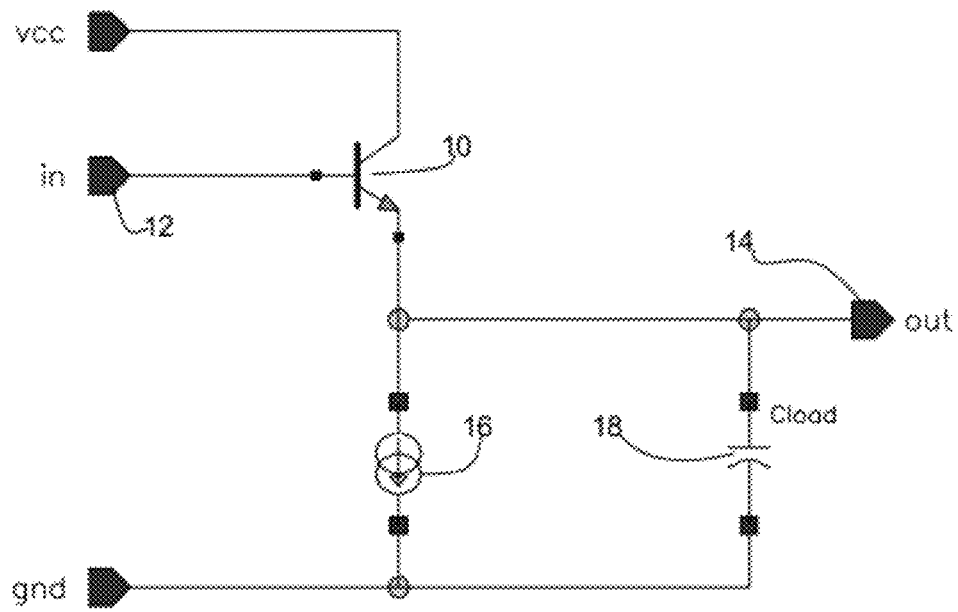
FIG. 1 shows a known emitter follower buffer circuit.

FIG. 1 shows a basic source/emitter follower circuit.

The transistor 10 is a BJT in the case of an emitter follower and an FET in the case of a source follower. The circuit input 12 is applied to the base/gate, and the collector/drain is connected to the high voltage rail VCC. The emitter/source is coupled to the output 14 and also to ground "gnd" through a biasing current source 16. An output load is shown as capacitor 18.

The current needed to drive the capacitive load is provided by the transistor, and this changes its $V_{BE}$ or $V_{GS}$ voltage. Consequently the linearity of the signal is degraded when large driving currents are needed.

Third harmonic distortion ($HD_3$) has been derived for an emitter follower (bipolar transistor). It uses the log relationship linking the base-emitter voltage of a transistor and its emitter current (I).

$$V_{BE} = V_T \cdot \log\left(\frac{I}{I_S}\right)$$

$$HD_3 = \frac{1}{12}\left(\frac{dI}{I_o}\right)^3 \frac{V_T}{V_p}$$

In these equations, $I_S$ is the bipolar transistor saturation current, $V_T$ is the thermal voltage (25 mV at room temperature), $I_0$ is the bias current of the follower current source, dI is the peak signal current and Vp is the peak signal voltage.

It is shown below how 10% of modulation for the transistor current is too much, if a linearity of 110 dB is required, as requested in high performance ADCs.

$$HD_3 = \frac{1}{12}(10\%)^3 \frac{25 \text{ mV}}{0.5 \text{ V}} = 106 \text{ dB}$$

Figure 2:
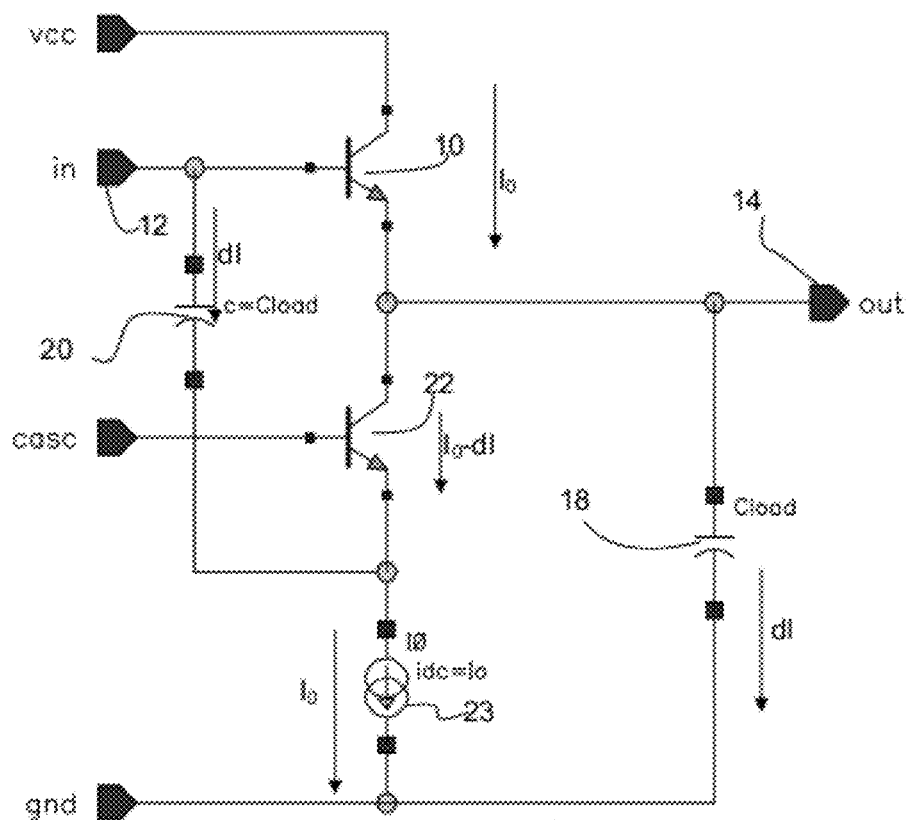
FIG. 2 shows a known improvement to the circuit of FIG. 1.

In the topology proposed in US2009/0315594, a duplicate of the load circuit is introduced. Consequently, the buffer transistor 10 sees a quasi constant current, independent of the signal, resulting in improved distortion. FIG. 2 shows the circuit of US2009/0315594, and shows an additional capacitor 20. The current source 16 is implemented as a cascode circuit including transistor 22 and a further cascode transistor implementing current source 23. The current values are shown, and it is clear that the load current I can vary without the transistor current $I_0$ needing to change. The additional capacitance 20 connects between the input and the cascode circuit. However, a drawback of the structure is that a large capacitance 20 is present at the buffer input.

There is therefore still a need for a buffer circuit with high linearity, high current drive capability, and large input impedance. All these high performance parameters should be obtained at low power consumption. The buffer should also preferably be capable to drive loads such as filters. These requirements are of special interest in the field of buffer circuits for the drive of high performance ADC.

Figure 3:
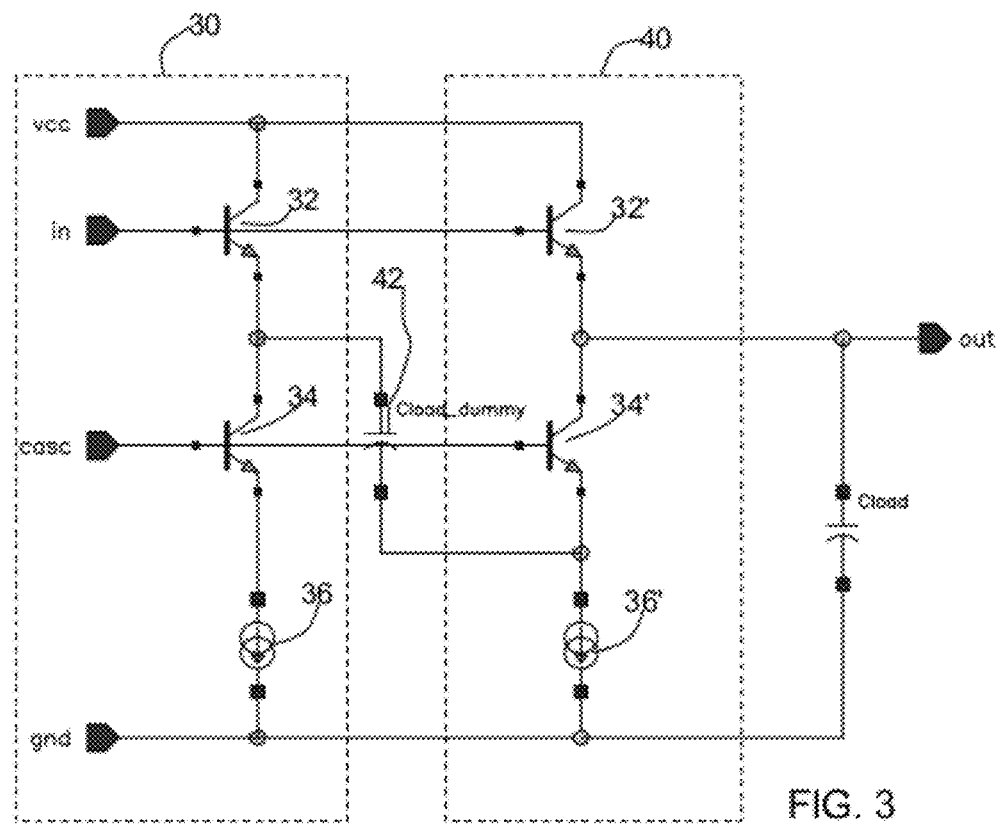
FIG. 3 shows a first example of circuit in accordance with the invention.

FIG. 3 shows an example of circuit of the invention.

The first, input stage 30 of the circuit corresponds to the basic prior art circuit of FIG. 1, with the current source implemented as a cascode circuit. The input stage comprises an input transistor 32 with the base/gate connected to the input voltage, and the collector/drain connected to the high voltage line Vcc. The emitter/source is connected to a constant current source which includes at least a first cascode transistor 34. The output is taken from the emitter/source. The current source 36 can be implemented by a second cascode transistor.

The complete circuit is mirrored in an output stage 40. Thus, the output stage comprises an input transistor 32' with the base/gate connected to the input voltage, and the collector/drain connected to the high voltage line Vcc. The emitter/source is connected to a constant current source which includes at least a first cascode transistor 34'. The output is taken from the emitter/source. The current source 36' can be implemented by a second cascode transistor.

The output of the input stage 30 is connected to the emitter/source of the cascode transistor 34', through a buffer capacitor 42.

The input stage 30 acts as a buffer for the dummy capacitor 42. In this way, the input impedance is thus greatly improved.

For best linearity enhancement, the current generated in the dummy capacitor 42 should be the same as the current in the load capacitance 18. This is the case since the voltage on the top plate of the load capacitance 18 is in phase with the top plate of the dummy load capacitor 42 (because of the same frequency response of input stage follower circuit 30 and the output stage follower circuit 40). In the same way as for the circuit of FIG. 2, the load current can change without the current through the transistor 32' changing.

The current flowing through the dummy load capacitor 42 is fed to the current source circuit such that the current source current is equal to the sum of the current through the cascode transistor 34' and the current through the dummy load capacitor. Part of the current through the input transistor 32' drives the load, but by adding the same current back at the node between the cascode transistor 34' and the current source 36', the current through the input transistor 32' is constant.

The topology therefore helps reduce distortion at high frequencies.

The circuit of the invention can be used to obtain improved performance in various types of circuit.

Figure 4:
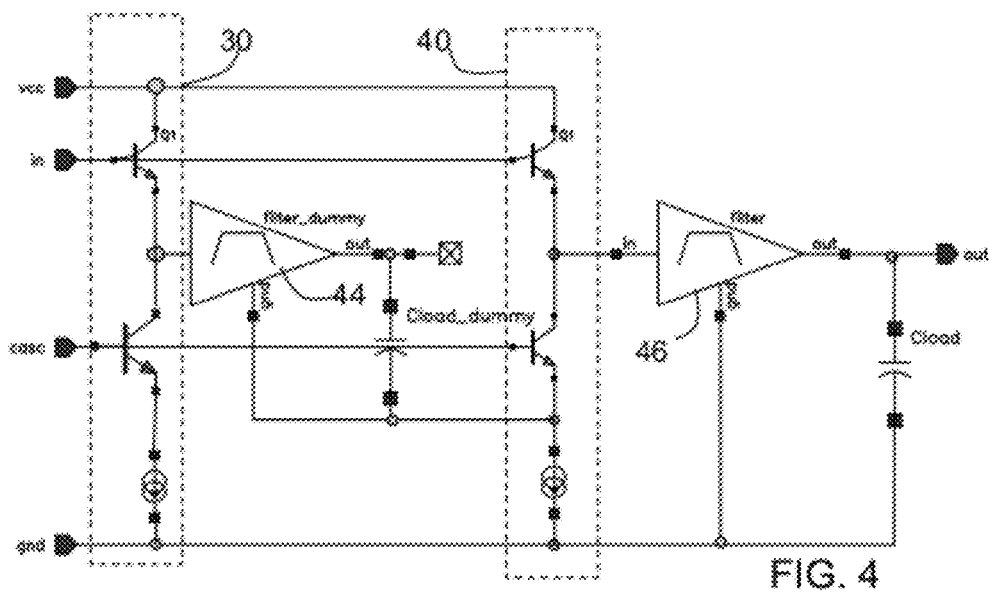
FIG. 4 shows a second example of circuit in accordance with the invention.

FIG. 4 shows the follower circuit of the invention used for driving a filter.

When the buffer needs to drive a filter, the filter is duplicated as shown at 44. This means that the current needed to drive the input of the load filter 46 is generated to the ground terminal of the dummy load filter. In one example, the output of the dummy load filter 44 is open circuit so that all current drawn by the filter circuit passes to ground. Thus, this connection enables the current drawn to be represented.

The dummy filter can be loaded by a dummy load, for example if its impedance is low. This results improved distortion improvement, in that the load at the output of the (real) filter is also replicated.

This is shown in FIG. 4, in which the output load is shown as Cload, and this is replicated at the output of the dummy filter circuit as Cload_dummy, between the output of the dummy filter and the ground line.

Figure 5A:
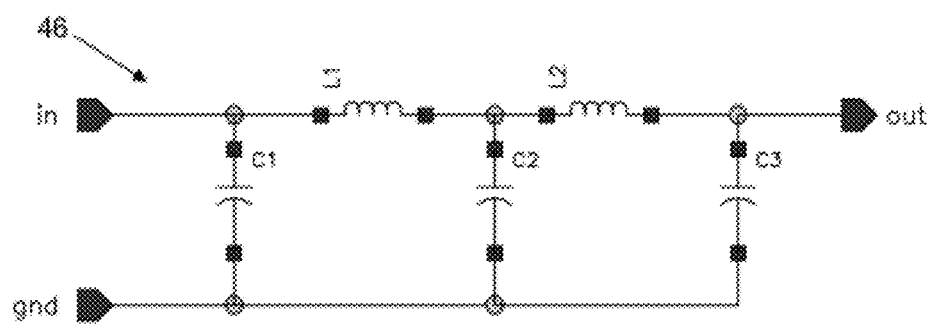
FIGS. 5A to 5C show examples of filter circuit that can be used as the output load of the buffer circuit in accordance with the invention.

FIG. 5A shows an example of low pass filter which can be used as the load filter 46. As shown, the filter comprises a chain of LC filter stages between the input and output, with series inductors and shunt capacitors to ground. A copy of this filter is provided as the dummy filter circuit 44. This arrangement reduces the emitter follower distortion.

Figure 5B:
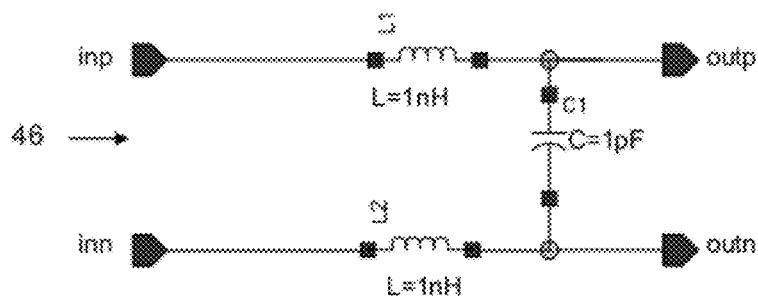
Figure 5C:
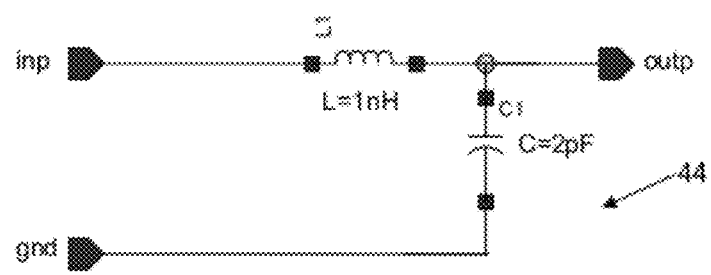

If a differential filter (or other differential load generally) is used as the load, a single ended dummy load filter (or single ended load general) is used as the dummy load. For example, FIG. 5B shows a differential low pass filter 46 as the load, and FIG. 5C shows the corresponding single ended dummy load filter 44.

Figure 6:
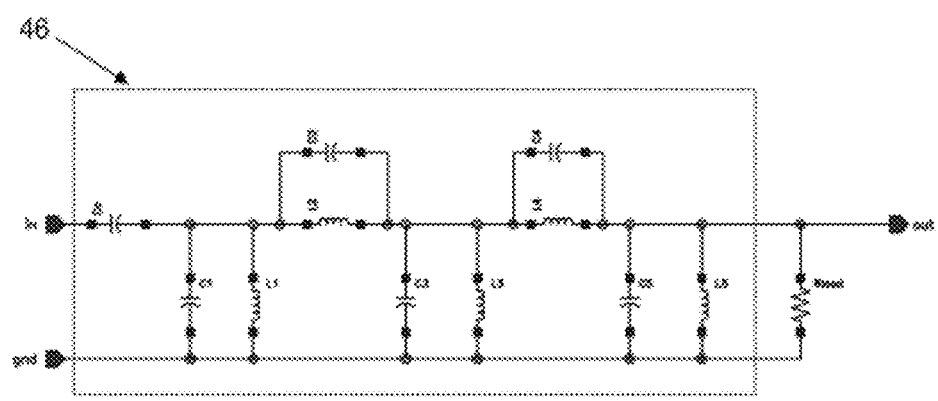
FIG. 6 shows a second example of filter circuit that can be used as the output load of the buffer circuit in accordance with the invention.

FIG. 6 shows an example of a band-pass filter which can be used as the load filter 46. As shown, the filter comprises parallel LC building blocks. The LC building blocks are arranged in series between the input and output, and also arranged as shunt units to ground. The input is connected to the LC network through an input capacitor. The output is connected to ground through a load resistance.

The dummy filter can be loaded by a dummy load if its impedance is low. This would result in the best distortion improvement, in that the load at the output of the (real) filter is also replicated.

In the examples above, the circuit comprises an input stage and an output stage, with the input stage serving to increase the input impedance. However, the input stage may not be required depending on the nature of the load and the circuit in which the buffer is to be used.

One aspect of the invention is therefore the replication of a filter load, but with or without the input buffer stage. If no input buffer circuit is used, the circuit is then as shown in FIG. 4 but without the components in block 30. The input "in" is then coupled to the input of the dummy filter circuit 44 as well as to the follower transistor in the output stage 40.

Figure 7:
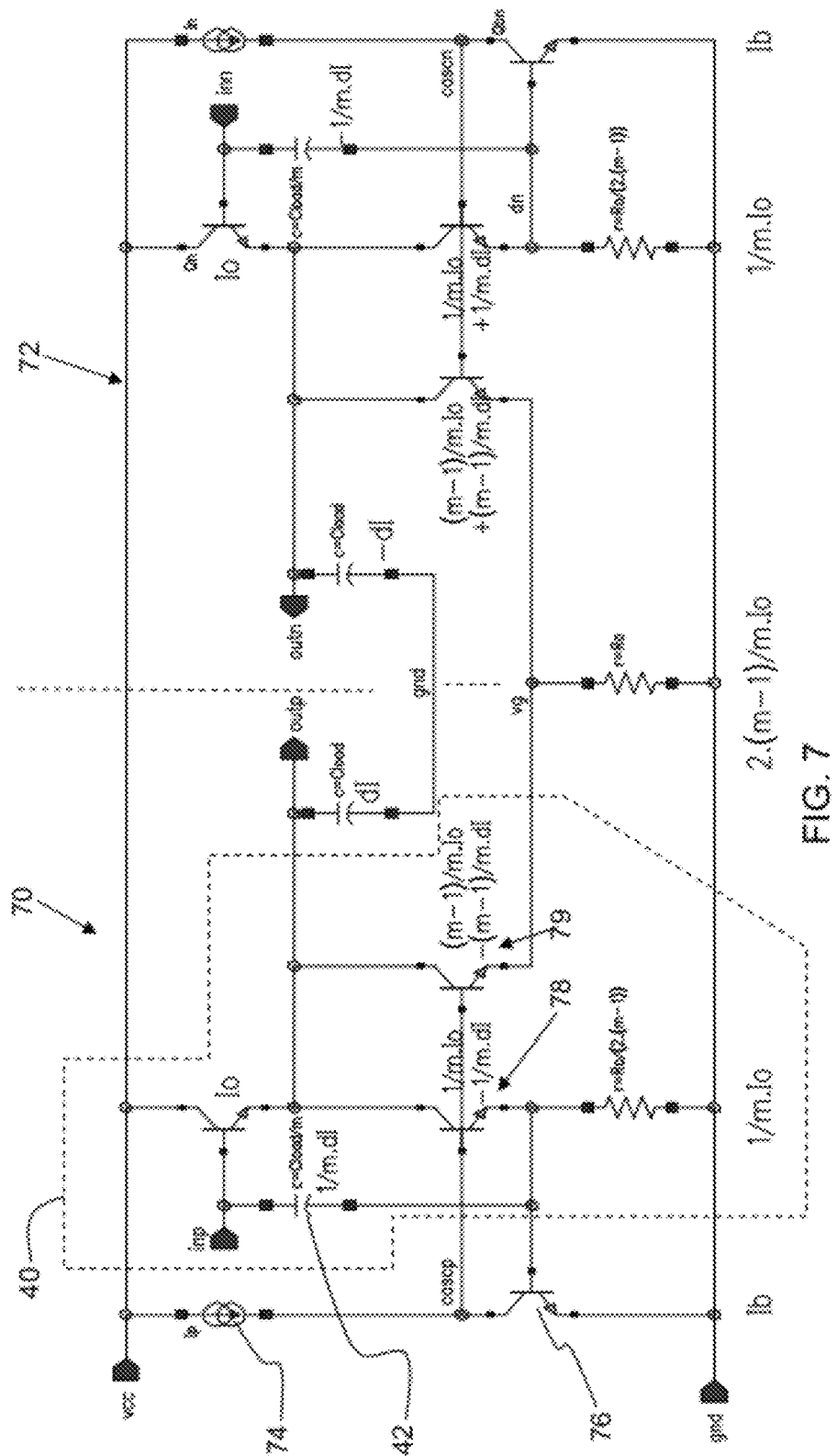
FIG. 7 shows a third example of circuit in accordance with the invention.

In accordance with another aspect of the invention, the dummy load can be a rescaled version of the load. FIG. 7 shows how this can be implemented using a dummy input capacitor which is m times smaller than the load capacitor.

FIG. 7 shows a differential voltage buffer which essentially comprises two voltage buffers 70,72 in parallel. One voltage buffer 70 is for positive voltages and the other 72 is for negative voltages. FIG. 7 does not show input stages (30 in FIG. 3) as this rescaling aspect of the invention can also be implemented without the use of the input stage. FIG. 7 only shows the output stages 40. However, the input stage can again be provided.

The positive buffer 70 comprises a current source 74 and transistor 76 for generating the gate/base voltage for the cascode transistors. There are two cascode transistors 78,79 which together comprise a current mirror circuit with one transistor 79 dimensioned with a ratio of (m−1) times the other 78. This scales the current through the buffer load capacitor 42 by a factor (m−1).

The current $I_0$ of the input transistor is split between the transistors 78,79 in the ratio 1:(m−1). The current through the buffer capacitor 42 is 1/m times the output current dl because the buffer capacitor is scaled by the ratio 1/m.

The current values are shown in FIG. 7.

The current $I_0$ is again independent of the output current dl. In particular, a change in the current dl causes the current in the transistors 78 and 79 to change such that the change in current is fully accounted for the cascode transistors, without the current $I_0$ needing to change.

The resistors in the circuit simply act as current paths, with values to give suitable bias voltage levels.

The negative buffer circuit 72 functions in the same way, but handles an output current in the opposite sense and compensates for this in the opposite sense as a result of the negative input voltage to inn compared to the positive voltage to inp.

The techniques outlined above can be combined. For example, the capacitance scaling explained above with reference to FIG. 7 can be applied to a filter. In this case, the duplicated filter is rescaled by decreasing the filter capacitors by a factor m, while increasing the inductors by the factor m. The duplicated buffer branch will results in larger input impedance. The current mirror arrangement functions in the same way to scale up the filter currents.

The principle of scaling a dummy load by adding a system that copies and multiplies the current of the cascode transistor 78 can be implemented in various ways, and FIG. 7 is not the only possible way to implement this.

Figure 8:
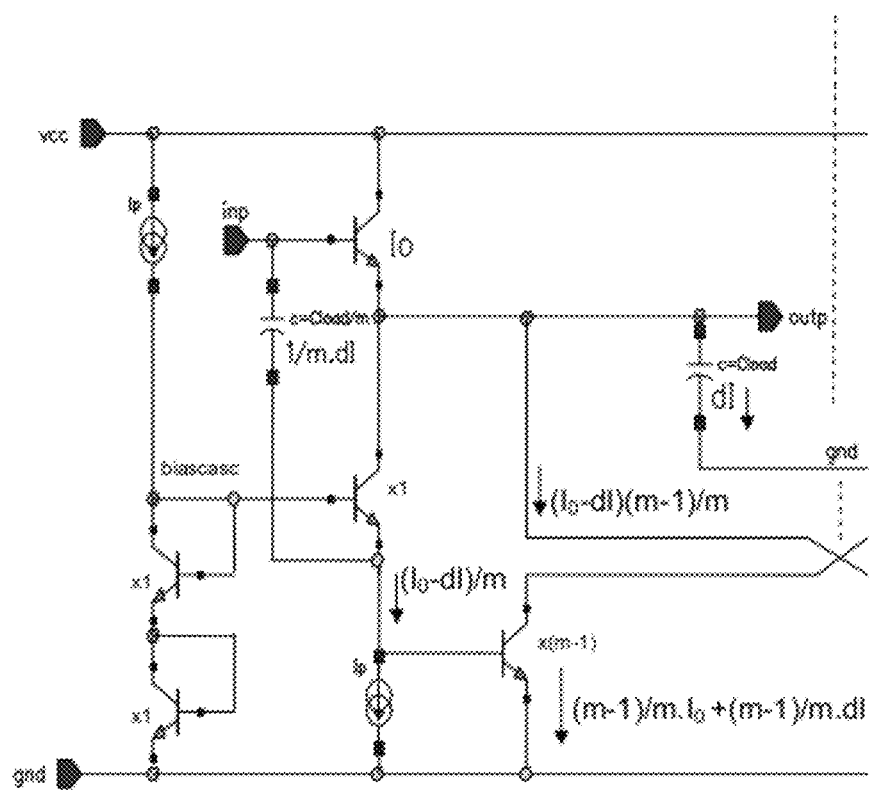
FIG. 8 shows an alternative implementation to achieve the same result as the circuit of FIG. 7.

FIG. 8 shows an alternative implementation, and shows only how the left half of the circuit of FIG. 7 is modified. The modification to the right half of FIG. 7 is analogous.

The output current is again split in the ratio 1:(m−1), but in this implementation the pair of transistors which implement the current mirror function comprise one transistor (labeled x1 below the input transistor) passing a current on one side of the circuit and another (labeled x(m−1)) passing a current derived from the other side of the circuit. Thus, the transistor x1 is paired with a transistor on the other side (not shown) and the transistor x(m−1) is paired with the transistor on the other side corresponding to x1.

The paired transistors x1 and x(m−1) on opposite sides of the circuit can again be considered to comprise a current mirror circuit, and are arranged so that the ratio between their currents is again 1:(m−1).

The currents through x1 and x(m−1) are shown.

Some examples of the invention provide a buffer with improved linearity and higher input impedance. The buffer is therefore capable of driving a low impedance load The invention can be applied to source/emitter follower circuits, implemented using one of many different kind of transistor technologies, such as NPN, PNP, NMOS, PMOS transistors.

The invention is of particular interest for use in communication system base stations. In order to compete on data rate availability, one possibility is to provide enhanced performance, and another is to provide increased available bandwidth by increasing the ADC sampling rate. In both approaches, an improved input buffer is a key requirement.

Various modifications will be apparent to those skilled in the art.

The invention claimed is:

1. A buffer circuit comprising:
   an input stage comprising a source or emitter first follower transistor;
   an output stage comprising a source or emitter second follower transistor and a current source circuit, in series between voltage supply lines, each of the first and the second follower transistors including a gate; and
   a load provided between the output of the input stage and the current source circuit of the output stage, wherein the load comprises a representation of an output load of the buffer circuit, wherein each gate is directly connected to a common input pin.

2. A buffer circuit, comprising:
   an input stage comprising a source or emitter first follower transistor;
   an output stage comprising a source or emitter second follower transistor and a current source circuit, in series between voltage supply lines, each of the first and the second follower transistors including a gate; and
   a load provided between the output of the input stage and the current source circuit of the output stage, wherein the load comprises a representation of an output load driven by the output stage of the buffer circuit, wherein the gates of the first and the second follower transistors are connected to a common input pin whereas input voltage signals are applied for controlling the first and the second follower transistors through the gates; and wherein
      the input stage further includes another current source and a first cascode transistor connected in series with the first source or emitter follower transistor, between the voltage supply lines;
      the output stage includes a second cascode transistor connected in series between the second source or emitter follower transistor and the current source;
      the buffer circuit is configured and arranged to provide an output, via the second source or emitter follower transistor, based on an input received at the input pin;
      the current source circuit is configured and arranged to pass current corresponding to a sum of current passed through the second cascode transistor and current passed through the load; and
      the second source or emitter follower transistor is configured and arranged to provide current, and to drive the output load with a portion of the provided current.

3. A buffer circuit as claimed in claim 1, wherein the second follower transistor is configured and arranged to drive the load by adding a current to a node between a second cascode transistor and the current source circuit of the output stage, and to produce a current that is constant.

4. A buffer circuit as claimed in claim 1, wherein the buffer circuit comprises a first cascode transistor and a second cascode transistor.

5. A buffer circuit as claimed in claim 1, wherein:
   the current source circuit of the buffer circuit comprises a first cascode transistor having an input connected to the source or emitter of the source or emitter second follower transistor, wherein the output of the first cascode transistor is connected to a current source, and wherein the load is provided between the output of the input stage and the output of the first cascode transistor,
   wherein the buffer circuit comprises a second cascode transistor.

6. A buffer circuit as claimed in claim 1, wherein:
   the buffer circuit comprises a first cascode transistor and a second cascode transistor, and wherein the load comprises a filter circuit with an open circuit output.

7. A buffer circuit as claimed in claim 1, wherein the first follower transistor is configured and arranged with the load to generate a current via the load that mirrors current in the output load.

8. A buffer circuit as claimed in claim 1, wherein the load comprises a capacitor.

9. A buffer circuit as claimed in claim 1, wherein the load comprises a filter circuit.

10. A buffer circuit as claimed in claim 1, wherein the current source circuit of the output stage comprises a first cascode transistor having an input connected to the source or emitter of the source or emitter second follower transistor, wherein the output of the first cascode transistor is connected to the current source circuit of the output stage, and wherein the load is provided between the output of the input stage and the output of the first cascode transistor.

11. A buffer circuit as claimed in claim 1, wherein said input stage has the source or emitter first follower transistor and another current source circuit, in series between voltage supply lines, wherein the current source circuit of the input stage comprises a first cascode transistor connected to the source or emitter of the source or emitter second follower transistor, wherein the output of the first cascode transistor is connected to another current source.

12. A buffer circuit as claimed in claim 1, further comprising the output load.

13. A circuit, comprising:
   a buffer circuit as claimed in claim 1; and
   a load connected to the output of the buffer circuit, wherein the output load exhibits a capacitance that is equal to a capacitance exhibited by the load provided between the output of the input stage and the current source circuit of the output stage.

14. A circuit as claimed in claim 1, further comprising an analogue to digital converter circuit.

15. A voltage buffering method, comprising using a buffer circuit as claimed in claim 1:
   providing an input voltage to the input stage;
   deriving an output voltage from the output stage;
   providing the output voltage to the output load; and
   controlling the first and the second follower transistors through the gates by applying input voltage signals at the common input pin.

* * * * *